United States Patent [19]

Araseki et al.

[11] 4,317,208

[45] Feb. 23, 1982

[54] ADPCM SYSTEM FOR SPEECH OR LIKE SIGNALS

[75] Inventors: Takashi Araseki; Kazuo Ochiai, both of Tokyo, Japan

[73] Assignee: Nippon Electric Co., Ltd., Tokyo, Japan

[21] Appl. No.: 79,724

[22] Filed: Sep. 28, 1979

[30] Foreign Application Priority Data

Oct. 5, 1978 [JP] Japan .............................. 53-123255

[51] Int. Cl.³ .......................................... H04L 25/16
[52] U.S. Cl. .............................. 375/27; 340/347 AD; 332/11 R
[58] Field of Search ................. 179/15.5 SR; 375/26, 375/27, 28, 30, 33; 332/11 D, 11 R; 340/347 AD; 371/37, 43; 364/724

[56] References Cited

U.S. PATENT DOCUMENTS 4,071,842  1/1978  Tewksbury ................. 340/347 AD
4,093,962  6/1978  Ishiguro et al. .................... 364/724
4,144,543  3/1979  Koga .................................... 325/27

OTHER PUBLICATIONS

IBM Technical Disclosure Bulletin, vol. 15, No. 11, Apr. 1973, pp. 3338–3341, "Adaptive Rate Delta Modulator".

Primary Examiner—Benedict V. Safourek
Attorney, Agent, or Firm—Sughrue, Mion, Zinn, Macpeak & Seas

[57] ABSTRACT

An adaptive differential pulse code modulation (ADPCM) system includes a predictor which predicts a sample value based on past prediction errors and coefficients which are adaptively corrected to lessen the difference, i.e. the prediction error, between the predicted values and the actual values. The predictor is duplicated in the receiver, has no feedback loop and thus instability due to transmission errors is eliminated. The system can also include a second predictor whose output is combined with that of the first predictor to obtain the predicted value. The second predictor output is based on past sums of the prediction error and the predicted value and coefficients which are adaptively corrected. The second predictor is in a feedback loop but instability is prevented by choosing the coefficients used.

12 Claims, 4 Drawing Figures

ADPCM SYSTEM FOR SPEECH OR LIKE SIGNALS

BACKGROUND OF THE INVENTION

The present invention relates to a differential pulse-code modulation (DPCM) system and, more particularly, an adaptive DPCM (ADPCM) system for performing frequency band compression of speech or like signals.

A DPCM system utilizing redundancy of a speech signal is a band compression system in which the prediction of the amplitude of each sample of the speech signal at the present time point is made on the basis of the past speech signal sample. The basis for such a prediction is that speech signal samples have a high degree of correlation with each other. The simplest DPCM method is to use as the predicted value either the amplitude value of the preceding sample or the product of that preceding sample and a value slightly smaller than 1. A DPCM system improves the signal to noise ratio (S/N) by about 6 dB (decibel) over a PCM system when speech signals are transmitted with the same number of bits. For the same S/N ratio, a DPCM system can save about 1 bit per sample as compared with a PCM system.

As a practical matter, a plurality of the past samples as well as one past sample may be used for the purpose of band compression. More in detail, a predicted value $X_j$ of a speech signal (sample) $X_j$ at a time point j is given by:

$$X_j = A_1 \cdot X_{j-1} + A_2 \cdot X_{j-2} + \ldots A_n \cdot X_{j-n} \tag{1}$$

where $A_1, A_2, \ldots, A_n$ are called the prediction coefficients and are so selected as to lessen the difference between $X_j$ and $X_j$, i.e., a prediction error. Once the prediction coefficients optimum for the speech signal are selected, an adequate increase of n (about 5 to 8) improves S/N ratio by approximately 10 dB compared with the PCM system. The characteristics of a speech signal vary with time, so that the optimum values of the coefficients also change. Therefore, if the optimum prediction coefficients are selected adaptively to the time-variation of the speech signal, the S/N ratio can be improved by approximately 14 dB. This improvement can be similarly achieved for other signals lying within the bandwidth of a speech signal, such as signals from a data modem (modulator-demodulator) equipment by using the DPCM system.

The prediction coefficients are obtained by the following two methods: one is to analyze a speech signal for the optimum prediction coefficients and the other is to adaptively correct the prediction coefficients so as to lessen the prediction error while the prediction error is being observed. The former method must transmit the quantitized prediction error signal and the prediction coefficients obtained. The latter method need not transmit the prediction coefficients, resulting in simplifying the circuit structure in the system. An ADPCM system using the latter method is discussed by David L. Cohn et al. in his paper entitled "The Residual Encoder— An Improved ADPCM System for Speech Digitization", IEEE TRANSACTIONS ON COMMUNICATIONS, VOL. COM-23, No. 9, September issue, 1975, pp. 935-941. However since the ADPCM system is vulnerable to transmission errors, the system needs extra hardware to eliminate the error, deteriorating S/N ratio and making the system complicated and costly to manufacture.

Accordingly, one object of the invention is to provide an ADPCM system with a simple circuit construction which is stably operable with a great improvement of S/N ratio.

SUMMARY OF THE INVENTION

To achieve the above-mentioned object of the invention, there is provided an ADPCM system which comprises:

A transmitter including a subtractor for obtaining the difference between an input signal and a predicted value, a quantizer for quantizing the output signal from the subtractor, and a decoder which stores the output signal given from the quantizer, multiplies at least one past signal of those output signals derived from the quantizer by at least one coefficient, calculates the sum of the products as results of the multiplications, adaptively corrects the coefficient so as to lessen the output signal given from the quantizer, and producing the sum of the products as a predicted value or a part of the predicted value; and a receiver including a decoder which receives and stores the output signal given from the quantizer in the transmitter, multiplies at least one past output signal obtained from the quantizer by at least one coefficient, calculates the sum of the results of the multiplications, adaptively corrects the coefficient so as to lessen the output signal given from the quantizer, and produces the sum of the multiplication results as a predicted value or a part of the predicted value, and an adder for calculating the sum of the predicted value and the output signal given from the quantizer and producing it as a reproduction signal.

BRIEF DESCRIPTION OF THE DRAWINGS

Other objects and features of the invention will be apparent from the following description taken in connection with the accompanying drawings, in which.

In the drawings, like reference numerals represent like structural elements.

DETAILED DESCRIPTION OF THE PREFERRED EMBODIMENTS

A conventional ADPCM system will be described with reference to FIGS. 1A and 1B. Before entering the description, it should be understood that, although the waveforms are expressed in analog form in FIG. 1B, digital signals are used in the systems shown in FIGS. 1A, 2, and 3. Although not shown, analog to digital converters are used at proper locations, such as the preceding stage of the ADPCM systems for converting the analog signals into digital signals.

Figure 1A:
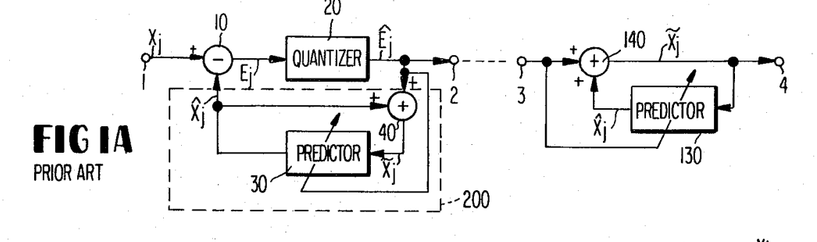
FIG. 1A shows a schematic block diagram of a conventional ADPCM system.
Figure 1B:
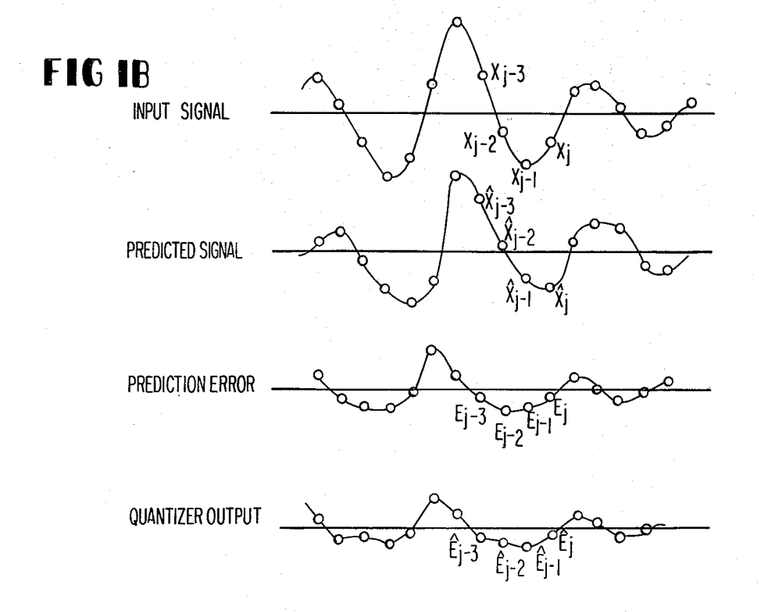
FIG. 1B shows waveforms for describing the system shown in FIG. 1A.

Referring to FIG. 1A, a speech signal $X_j$ to be transmitted is applied to a terminal 1 of a transmitter at a time point j. A difference signal $E_j$ between the input signal and the output signal given from a predictor 30 is quantized by a quantizer 20 and is outputed from a terminal 2. The output signal $E_j$ of the quantizer 20 and a predicted value $\tilde{X}_j$ are added to each other and the result of the addition is sent to the predictor 30. The predictor 30 produces the predicted value $\tilde{X}_j$ using a past input signal $\tilde{X}_{j-1}$ applied to the predictor 30. The predicted value is given by:

$$\tilde{X}_j = \sum_{i=1}^{N} A_i^j \cdot \tilde{X}_{j-i} \qquad (2)$$

where $A_i^j$ ($i=1$ to $N$) are prediction coefficients. The coefficients $A_i^j$ are adaptively corrected in accordance with equation (3).

$$A_i^{j+1} = A_i^j + g \cdot F_1(\tilde{X}_{j-i}) \cdot F_2(E_j) \qquad (3)$$

where g is a positive small value, which is about $2^{-3}$, and $F_1$ and $F_2$ are non-decrease functions.

The predictor 30 and the adder 40 serve as a local decoder.

A receiver, that is, decoder receives the signal transmitted from the transmitter at the terminal 3. An adder 140 calculates the sum of the incoming signal and the output signal $\tilde{X}_j$ given from a predictor 130. The adder 140 then produces a reproduction signal $\tilde{X}_j$ through a terminal 4. The decoder operates in the same manner as that of the transmitter. When a predictor 130 and the adder 140 are identical to those 30 and 40 of the transmitter, the reproduction signal $\tilde{X}_j$ in the receiver is exactly the same as that $\tilde{X}_j$ from the adder 40 of the transmitter. In this manner, without transmitting the prediction coefficients, the prediction coefficients can be obtained on the basis of only the quantized prediction error signal for reproduction of an original signal. The predictor 30 or 130 may be composed of the type shown in FIG. 1 on page 936 in the above-mentioned article by David L. Cohn et al.

In an actual transmission line, since a transmission error takes place frequently, however, the above-mentioned discussion cannot be applied to the practical system. To be more specific, the prediction errors produced are different from each other at the transmitter and receiver and therefore a reproduction signal is greatly different from an original signal. For the gradual elimination of the adverse effect of the transmission error once produced, the following equation to correct the prediction coefficients is used:

$$A_i^{j+1} = A_i^j \cdot (1-\delta) + g \cdot F_1(\tilde{X}_{j-i}) \cdot F_2(E_j) \qquad (4)$$

where $i=1$ to N and, $\delta$ is a positive value much smaller than 1, and g is a proper positive constant. As $\delta$ becomes larger, the adverse effect of the transmission error disappears more rapidly, resulting in degrading the prediction performance. For example, when $\delta$ is selected to be a practical value, the improvement of S/N ratio is 10 dB or less. This restricts the selection of the value of $\delta$ so as not to be larger in its value. The constraint of said selection allows the case where an error produced beyond the error eliminating ability greatly degrades the speech quality. The most serious problem involved in the construction shown in FIG. 1A is the instability of the operation in the decoder on the receiver side having a feedback loop when a transmission error takes place. In such a situation, since the predictor 130 and the adder 140 form a closed circuit, some of the selected prediction coefficients might cause the receiver to oscillate or to be unstable. In fact, it was easily ensured in our experiment that an intentional transmission error resulted in the occurrence of oscillations or unstable operation at the receiver. Once the operation becomes unstable, a long time is needed until the operation settles down to be stable. A countermeasure is taken for this problem as follows: Namely, by monitoring the prediction coefficient on the receiving side, an unstable operation is detected and some measure for its instability is taken on the basis of the detection. However, it is difficult to check the stability of operation and this results inherently in a larger system.

Figure 2:
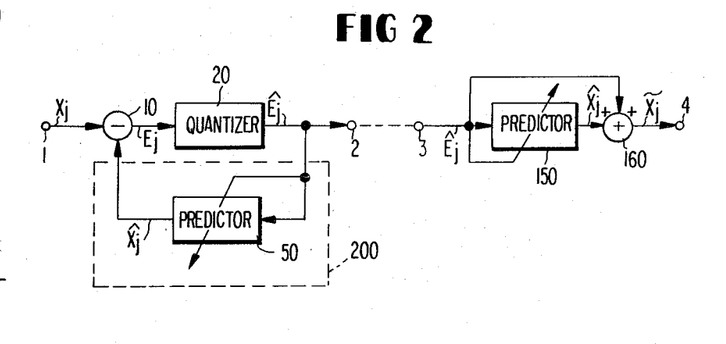
FIG. 2 shows a schematic block diagram of a first embodiment of the invention.

In the present invention, the predicted value of the speech signal $\tilde{X}_j$ is obtained from the output signal $E_j$ of the quantizer, not from $\tilde{X}_j$, in the following manner:

$$\tilde{X}_j = \sum_{i=1}^{M} B_i^j \cdot E_{j-i}$$

where $B_i^j$ represent the prediction coefficients in the predictors 50 and 150 as shown in FIG. 2.

This approach avoids the adoption of a closed circuit in both the transmitter and receiver, so that even occurrence of the transmission error never renders its operation unstable.

Here, the coefficients $B_i^j$ may be adaptively obtained by equation (5):

$$B_i^{j+1} = (1-\delta) \cdot B_i^j + g \cdot E_{j-i} \cdot E_j \qquad (5)$$

where $i=1$ to M, and $\delta$ is a positive value much smaller than 1 to be used to erase a detrimental effect of the transmission error. In the absence of the quantizer 20, that is, when $\tilde{E}_j = E_j$, the transmitter serves as a filter performing the following operation:

$$E_j = X_j - \sum_{i=1}^{M} B_i^j \cdot E_{j-i} \qquad (6)$$

with the transfer function of:

$$\frac{1}{1 + \sum_{i=1}^{M} B_i^j \cdot E_{j-i}} \qquad (7)$$

An implementation of the just-mentioned invention, which is a first embodiment, is illustrated in FIG. 2 in block form. The transmitter quantizes the difference between a signal $X_j$ and its predicted value $\tilde{X}_j$ by a quantizer 20 for transmission. The quantizer 20 may be easily realized by utilizing techniques discussed in a paper "Adaptive Quantization in Differential PCM coding of Speech" by P. Cummiskey et al., The Bell System Technical Journal, Vol. 52, No. 7, September issue, 1973, pp. 1105 to 1118. No detailed description of the quantizer will be given hereunder. The output signal $E_j$ of the quantitizer 20 is inputed to a predictor 50. The predictor 50 calculates a predicted value $\tilde{X}_j$ at a time point j by:

$$\tilde{X}_j = \sum_{i=1}^{7} B_i^j \cdot E_{j-i}. \qquad (8)$$

The coefficient $B_i^j$ are adaptively corrected depending on equation (5). On the receiver side, the quantized prediction error $E_j$ is applied to the predictor 150 which in turn produces a predicted value $\tilde{X}_j$ in accordance with equation (8). An adder 160 adds the prediction error signal $E_j$ to the predicted value $\tilde{X}_j$ to produce a reproduction signal $X_j$. The reason why the output signal $X_j$ of the adder 160 is used as an output signal will be apparent from the fact that if the quantizer 20 is not used, $X_j = X_j$. In the present invention, when the number M of the prediction coefficients is selected to be approximately 7 with a practical value of $\delta$ (i.e., about $2^{-6}$), S/N ratio for an incoming speech signal may improve by at least 10 dB compared with the PCM system.

Many suitable and well known predictors 50 and 150 may be employed in the present invention. One such predictor is disclosed in the article "A Twelve-Channel Digital Echo Canceler" in *IEEE Transactions on Communications*, Vol. COM-26, No. 5, May 1978, pp. 647-653, by D. L. Duttweiler. FIG. 4 is an illustration of the predictor disclosed in the above article. Input signals $E_j$ or $X_j$, depending on whether the predictor of FIG. 4 is used on the FIG. 1 or FIG. 2 embodiments, are applied to signal storage means 210 having a plurality of delay registers as shown. Each of the delay taps from storage means 210 are applied to associated convolution multiplers in multiplying means 230. Each of the convolution multipliers has an associated coefficient correcting means receiving the associated delay path from storage means 210, the output of the coefficient correcting means being applied to the other input of the associated convolution multiplier. The individual outputs from convolution multipliers in multiplication means 230 are applied to a summation accumulator 240 to provide the signal $X_j$.

Figure 3:
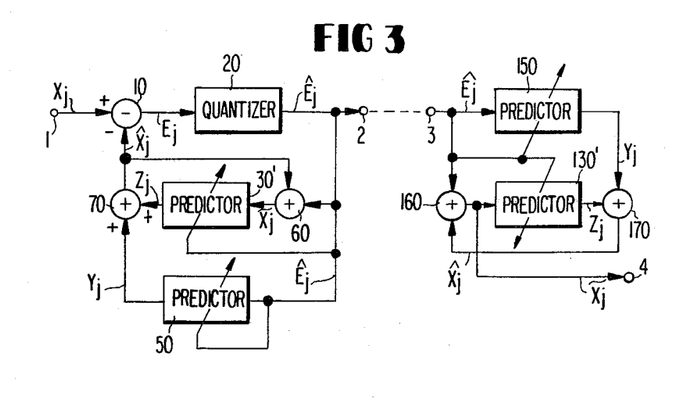
FIG. 3 shows a schematic block diagram of a second embodiment of the invention.

FIG. 3 shows a second embodiment of the invention using a pair of predictors, which further improves the performance over the first embodiment. In the present embodiment, the predicted value $X_j$ of the signal $X_j$ is expressed by:

$$X_j = Y_j + Z_j \quad (9)$$

where $Y_j$ and $Z_j$ are given by:

$$Y_j = \sum_{i=1}^{3} B_i^j \cdot E_{j-i} \quad (10)$$

$$Z_j = A^j \cdot X_{j-l} \quad (11)$$

$B_i^j$ are corrected depending on equation (5), and $A^j$ representative of the prediction coefficients in the predictors 30' and 130' are corrected depending on equation (12).

$$A^{j+1} = A^j \cdot (1-\delta) + g' \cdot E_j \cdot X_{j-l} \quad (12)$$

where $g' = 2^{-3}$.

$X_j$ in equation (11) is calculated by the adder 60 in accordance with the following equation (13):

$$X_j = X_j + E_j \quad (13)$$

Also, on the receiver side, the $Y_j$ and $Z_j$ are calculated by the predictors 130' and 150 and the predicted value $X_j$ is produced from the adder 170. A reproduction signal is the output $X_j$ given from the adder 160.

In this embodiment, the predictor 130' and the adders 160 and 170 form a closed loop, so that there is a concern that the transmission error renders the operation of the decoder unstable. Since the number of the prediction coefficients $A^j$ in the predictor 130' is 1, however, it is readily seen that $|A^j| < 1$ is a condition for the stability of the operation. Actually, the instability may be eliminated by adjusting both the transmitter and receiver so as to have $0 \leq A^j \leq 0.9$. In our experiment, it was observed that such adjustment provides no degradation of the performance.

In the present embodiment, if the coefficients of the predictors 50 and 150 are each 3, the S/N improvement of 14 dB is attained as compared with the PCM system. When the signal to be transmitted includes only the speech signal, if $A^j$ is fixed at about 0.9, the performance is never deteriorated.

The second embodiment having the two predictors appears complicated in structure. However, if pairs of $X_{j-i}$ and $E_{j-i}$, and $A^j$ and $B_i^j$ (i=1, 2, and 3) are subjected to the sum of products as is apparently understood from equations (10) and (11), each operation of the predictors 30 and 50 and the adder 70 is performed at a time. The structure of the embodiment shown in FIG. 3 is therefore comparable to that of the first embodiment shown in FIG. 2; rather, favorable results are expected since the number of the prediction coefficients is reduced.

When it is desired to increase the number of the prediction coefficients in the predictors 30' and 130' of FIG. 3, there is no concern that the transmission error causes the operation to be unstable, provided each coefficient is fixed so as to stabilize the system as mentioned above. On the other hand, when the number of the coefficients in the predictors 30' and 130' is small, such as 1 or 2, the judgement of the stability of the operation is performed easily despite the adaptive correction of the prediction coefficients in the predictors 30' and 130'. The predictors 30' and 130' used in the embodiment of the invention have the same constructions as those of the predictors 30 and 130 in FIG. 1A.

As mentioned above, the ADPCM system of the invention can ensure a perfect stability of the invention, even if the transmission error takes place, with improved S/N ratio and a simple circuit construction.

Although various aspects of our invention have been described and illustrated in detail, by way of embodiments, it is to be understood that the same is not by way of limitation.

What is claimed is:

1. An adaptive differential pulse code modulation system comprising:
 a transmitter including a subtractor for obtaining the differences $E_j$ between input signals $X_j$ and predicted values $X_j$, a quantizer for quantizing the output signals $E_j$ from said subtractor to obtain quantized output signals $E_j$, and transmit prediction means, having variable prediction coefficients and no feedback loop, for receiving quantized output signals from said quantizer and generating therefrom said predicted values $X_j$; and
 a receiver for receiving said quantized output signals and generating therefrom reproduction signals $X_j$, said receiver comprising receive prediction means, having variable prediction coefficients and no feedback loop, for receiving said quantizer output signals and generating therefrom receive prediction signals $X_j$, and a receive adder receiving as inputs said quantizer output signals and receive predicted values $X_j$ from said receive prediction means, the output of said adder comprising said reproduction signals.

2. A transmitter for an ADPCM system comprising:
 a subtractor for obtaining the differences $E_j$ between input signals $X_j$ and predicted values $X_j$; a quantizer for quantizing the output signals $E_j$ from said subtractor to obtain quantized output signals $E_j'$; and a transmit decoder receiving said quantizer output signals and generating therefrom said predicted values, said transmit decoder comprising a predictor, having no feedback loop, for receiving the output of said quantizer and generating therefrom said predicted values.

3. A receiver for an ADPCM system including a receive decoder, said receive decoder comprising:
receive prediction means, having no feedback loop, for receiving output signals $E_j'$ from a quantizer in a transmitter and for generating therefrom receive predicted values $X_j$; and an adder receiving as inputs said quantizer output signals and said receive predicted values and combining them to produce a reproduction signal $X_j$.

4. An adaptive pulse code modulation system as claimed in any one of claims 1-3 wherein said predicted values $X_j$ generated by each said prediction means are defined by:

$$X_j = \sum_{i=1}^{M} B_i^j \cdot E_{j-i}, \text{ and}$$

$$B_i^{j+1} = (1 - \delta) \cdot B_i^j + g \cdot E_{j-i} \cdot E_j,$$

where $\delta << 1$ and g is a positive constant and $B_i^j$ are prediction coefficients.

5. An adaptive pulse code modulation system as claimed in claim 4 wherein $$M \approx 7 \text{ and } \delta \approx 2^{-6}.$$

6. An adaptive differential pulse code modulation system comprising:
a transmitter having a subtractor for obtaining the differences $E_j$ between input signals $X_j$ and predicted values $X_j$, a quantizer for quantizing the output signals $E_j$ from said subtractor to obtain quantized output signals $E_j'$, a first prediction means (50), having no feedback loop, for receiving the outputs of said quantizer and generating therefrom first intermediate transmit prediction values $Y_j$, a first transmit adder receiving said first intermediate transmit prediction values and second intermediate transmit prediction values $Z_j$ and providing said predicted values $X_j$ to said subtractor, a second transmit adder receiving said predicted values and said quantizer outputs and providing output signals, and a second transmit prediction means receiving the output signals from said second transmit adder and generating therefrom said second intermediate transmit prediction values $Z_j$; and
a receiver including a first receive adder (160) for combining receive predicted values and said quantizer output signals to obtain reproduction signals $X_j$, a first receive prediction means, having no feedback loop, for receiving said quantizer output signals and generating therefrom first intermediate receive prediction values $Y_j$, a second receive adder (170) receiving second intermediate receive prediction values ($Z_j$) and said first intermediate receive prediction values and providing said receive predicted values to said first receive adder, and a second receive prediction means receiving said reproduction signals $X_j$ and generating therefrom said second receive intermediate prediction values $Z_j$.

7. A transmitter for an adpative differential pulse code modulation system comprising:
a transmitter having a subtractor for obtaining the differences $E_j$ between input signals $X_j$ and predicted values $X_j$, a quantizer for quantizing the output signals $E_j$ from said subtractor to obtain quantized output signals $E_j'$, a first prediction means (50), having no feedback loop, for receiving the outputs of said quantizer and generating therefrom first intermediate transmit prediction values $Y_j$, a first transmit adder receiving second intermediate transmit prediction values $Z_j$ and said first intermediate prediction values and providing said predicted values $X_j$ to said subtractor, a second transmit adder receiving said predicted values and said quantizer outputs and providing output signals, and a second transmit prediction means receiving the output signals from said second transmit adder and generating therefrom said second intermediate transmit prediction values $Z_j$.

8. A receiver for an adaptive differential pulse code modulation system comprising:
a receiver including a first receiver adder (160) for combining quantized output signals and receiver predicted values to obtain a reproduction signals $X_j$, a first receive prediction means, having no feedback loop, for receiving said quantized output signals and generating therefrom first intermediate receiver prediction values $Y_j$, a second receive adder (170) receiving second intermediate receive prediction values ($Z_j$) and said first intermediate receive prediction values and providing said receive predicted values to said first receive adder, and a second receive prediction means receiving said reproduction signals $X_j$ and generating therefrom said second receive intermediate prediction values $Z_j$.

9. An adaptive pulse code modulation system as claimed in any one of claims 6 or 7, wherein said first intermediate transmit prediction values $Y_j$ are defined by:

$$Y_j = \sum_{i=1}^{M} B_i^j \cdot E_{j-1}, \text{ and}$$

$$B_i^{j+1} = (1 - \delta) \cdot B_i^j + g \cdot E_{j-i} \cdot E_j,$$

where $\delta << 1$ and g is a positive constant;
and wherein said second intermediate transmit prediction values $Z_j$ are defined by:

$$Z_j = A_l^j \cdot X_{j-l}, \text{ and}$$

$$A_l^{j+1} = (1-\delta) \cdot A_l^j + g' \cdot E_j \cdot X_{j-l},$$

where g' is a positive constant.

10. An adaptive pulse code modulation system as claimed in claim 9 wherein $$0 \leq A_l^j \leq 0.9.$$

11. An adaptive pulse code modulation system as claimed in claim 9 wherein $M \approx 3$ and $$A_l^j \approx 0.9.$$

12. An adaptive pulse code modulating system as claimed in either one of claims 6 or 8 wherein said first receive intermediate prediction values $Y_j$ are defined by:

$$Y_j = \sum_{i=1}^{M} B_i^j \cdot E_{j-1}, \text{ and}$$

$$B_i^{j+1} = (1 - \delta) \cdot B_i^j + g \cdot E_{j-i} \cdot E_j,$$

where $\delta \ll 1$ and g is a positive constant; and wherein said second intermediate receive prediction values are defined by:

$$Z_j = A_l^j \cdot X_{j-l}, \text{ and}$$

$$A_l^{j+1} = (1-\delta) \cdot A_l^j + g' \cdot E_j \cdot X_{j-l},$$

where g' is a positive constant.

* * * * *

UNITED STATES PATENT AND TRADEMARK OFFICE
CERTIFICATE OF CORRECTION

PATENT NO. : 4,317,208
DATED : February 23, 1982
INVENTOR(S) : Takashi ARASEKI et al.

It is certified that error appears in the above—identified patent and that said Letters Patent is hereby corrected as shown below:

Column 1, line 30, delete "$X_j$" and insert -- $\hat{X}_j$ -- ;

line 33, equation (1), delete "$X_j$" and insert -- $\hat{X}_j$ -- (first occurrence) ;

line 37, delete "$X_j$" (second occurrence) and insert -- $\hat{X}_j$ -- .

Column 2, line 68, delete "$E_j$" and insert -- $\hat{E}_j$ -- .

Column 3, line 1, delete "$X_j$" and insert -- $\hat{X}_j$ -- ;

line 3, delete "$X_j$" and insert -- $\hat{X}_j$ -- ;

line 4, delete "$X_{j-1}$" and insert -- $\tilde{X}_{j-1}$ -- ;

between lines 5 and 10, equation (2), delete "$X_j$" (first occurrence) and insert -- $\hat{X}_j$ -- ;

between lines 10 and 15, equation (3), delete "$X_{j-1}$" and insert -- $\tilde{X}_{j-1}$ ; delete "$E_j$" and insert -- $\hat{E}_j$ -- ;

line 23, delete "$X_j$" and insert -- $\hat{X}_j$ -- ;

line 24, delete "$X_j$" and insert -- $\tilde{X}_j$ -- ;

UNITED STATES PATENT AND TRADEMARK OFFICE
CERTIFICATE OF CORRECTION

PATENT NO. : 4,317,208
DATED : February 23, 1982
INVENTOR(S) : Takashi ARASEKI et al.

It is certified that error appears in the above—identified patent and that said Letters Patent is hereby corrected as shown below:

Column 3, line 28, delete "$X_j$" and insert -- $\tilde{X}_j$ -- ;

line 29, delete "$X_j$" and insert -- $\tilde{X}_j$ -- ;

line 47, equation, delete "$X_{j-i}$" and insert -- $\tilde{X}_{j-i}$ -- ; delete "$E_j$" and insert -- $\hat{E}_j$ -- .

Column 4, line 11, delete "$X_j$" and insert -- $\hat{X}_j$ -- ; delete "$E_j$" and insert -- $\hat{E}_j$ -- line 12, delete "$X_j$" and insert -- $\tilde{X}_j$ -- ;

line 15, equation, delete "$X_j$" (first occurrence) and insert -- $\hat{X}_j$ -- ; delete "$E_{j-i}$" and insert -- $\hat{E}_{j-i}$ -- ;

between lines 25 and 30, equation (5), delete "$E_j$" (both occurrences) and insert -- $\hat{E}_j$ -- ;

line 32, delete "$E_j$" (second occurrence) and insert -- $\hat{E}_j$ -- ;

line 55, delete "$E_j$" and insert -- $\hat{E}_j$ -- ;

line 60, equation (8), delete "$X_j$" and insert -- $\hat{X}_j$ -- ; delete "$E_{j-i}$" and insert -- $\hat{E}_{j-i}$ -- ;

UNITED STATES PATENT AND TRADEMARK OFFICE
CERTIFICATE OF CORRECTION

PATENT NO. : 4,317,208
DATED : February 23, 1982
INVENTOR(S) : Takashi ARASEKI et al.

It is certified that error appears in the above—identified patent and that said Letters Patent is hereby corrected as shown below:

Column 4, line 65, delete "$E_j$" and insert -- $\hat{E}_j$ -- ;

line 66, delete "$X_j$" and insert -- $\hat{X}_j$ -- ;

line 68, delete "$E_j$" and insert -- $\hat{E}_j$ -- ; delete "$X_j$" and insert -- $\hat{X}_j$ -- .

Column 5, line 1, delete "$X_j$" and insert -- $\tilde{X}_j$ -- ;

line 2, delete "$X_j$" and insert -- $\tilde{X}_j$ -- ;

line 4, delete "$X_j$" (first occurrence) and insert -- $\tilde{X}_j$ -- ;

line 17, delete "$E_j$" and insert -- $\hat{E}_j$ -- ; delete "$X_j$" and insert -- $\tilde{X}_j$ -- ;

line 29, delete "$X_j$" and insert -- $\hat{X}_j$ -- ;

line 33, delete "$X_j$" (first occurrence) and insert -- $\hat{X}_j$ -- ;

between lines 35 and 40, equation (9), delete "$X_j$" and insert -- $\hat{X}_j$ -- ;

UNITED STATES PATENT AND TRADEMARK OFFICE
CERTIFICATE OF CORRECTION

PATENT NO. : 4,317,208
DATED : February 23, 1982
INVENTOR(S) : Takashi ARASEKI et al.

It is certified that error appears in the above—identified patent and that said Letters Patent is hereby corrected as shown below:

Column 5, between lines 40 and 45, equation (10), delete "$E_{j-i}$" and insert -- $\hat{E}_{j-i}$ --;

between lines 40 and 45, equation (11), delete "$X_{j-i}$" and insert -- $\tilde{X}_{j-i}$ --;

between lines 45 and 50, equation (12), delete "$E_j$" and insert -- $\hat{E}_j$ --; delete "$X_{j-1}$" and insert -- $\tilde{X}_{j-1}$ --;

line 53, delete "$X_j$" and insert -- $\tilde{X}_j$ --;

line 55, equation (13), delete in its entirety and insert -- $\tilde{X}_j = \hat{X}_j + \hat{E}_j$ --;

line 59, delete "$X_j$" and insert -- $\hat{X}_j$ --;

line 60, delete "$X_j$" and insert -- $\tilde{X}_j$ --.

Column 6, line 12, delete "$X_{j-1}$" and insert -- $\hat{X}_{j-1}$ --;

delete "$E_{j-i}$" and insert -- $\hat{E}_{j-i}$ --;

line 48, delete "$X_j$" and insert -- $\hat{X}_j$ --;

line 50, delete "$E_j$" and insert -- $\hat{E}_j$ --;

UNITED STATES PATENT AND TRADEMARK OFFICE
CERTIFICATE OF CORRECTION

PATENT NO. : 4,317,208

DATE : February 23, 1982

PAGE 5 OF 7

INVENTOR(S) : Takashi ARASEKI et al.

It is certified that error appears in the above—identified patent and that said Letters Patent is hereby corrected as shown below:

Column 6, line 54, delete "$X_j$" and insert -- $\hat{X}_j$ --;

line 56, delete "$X_j$" and insert -- $\utilde{X}_j$ --;

line 61, delete "$X_j$" and insert -- $\hat{X}_j$ --;

line 63, delete "$X_j$" and insert -- $\hat{X}_j$ --;

line 68, delete "$X_j$" and insert -- $\hat{X}_j$ --.

Column 7, line 2, delete "$E_j$" and insert -- $\hat{E}_j$ --;

line 12, delete "$E_j$" and insert -- $\hat{E}_j$ --;

line 14, delete "$X_j$" and insert -- $\utilde{X}_j$ --;

line 17, delete "$X_j$" and insert -- $\hat{X}_j$ --;

line 20, delete "$X_j$" and insert -- $\hat{X}_j$ --;

line 24, first equation, delete "$X_j$" and insert -- $\hat{X}_j$ --; delete "$E_{j-i}$" and insert -- $\hat{E}_{j-i}$ --;

line 27, second equation, delete "E" (both occurrences) and insert -- $\hat{E}$ --;

line 40, delete "$X_j$" and insert -- $\hat{X}_j$ --;

line 42, delete "$E_j$" and insert -- $\hat{E}_j$ --;

UNITED STATES PATENT AND TRADEMARK OFFICE
CERTIFICATE OF CORRECTION

PATENT NO. : 4,317,208

DATED : February 23, 1982

INVENTOR(S) : Takashi ARASEKI et al.

It is certified that error appears in the above—identified patent and that said Letters Patent is hereby corrected as shown below:

Column 7, line 59, delete "$X_j$" and insert -- $\underset{\sim}{X}_j$ -- ;

line 68, delete "$X_j$" and insert -- $\tilde{X}_j$ -- .

Column 8, line 3, delete "adpative" and insert -- adaptive -- ;

line 7, delete "$X_j$" and insert -- $\hat{X}_j$ -- ;

line 9, delete "$E_j$" and insert -- $\hat{E}_j$ -- ;

line 28, delete "$X_j$" and insert -- $\underset{\sim}{X}_j$ -- ;

line 37, delete "$X_j$" and insert -- $\tilde{X}_j$ -- ;

between lines 45 and 50, first equation, delete "$E_{j-1}$" and insert -- $\hat{E}_{j-1}$ -- ;

between lines 45 and 50, second equation, delete "E" (both occurrences) and insert -- $\hat{E}$ -- ;

line 55, first equation, delete "X" and insert -- $\tilde{X}$ --;

line 57, second equation, delete "E" and insert -- $\hat{E}$ -- ; delete "X" and insert -- $\tilde{X}$ -- .

Column 9, line 11, equation, delete "E" and insert -- $\hat{E}$ -- ;

UNITED STATES PATENT AND TRADEMARK OFFICE
CERTIFICATE OF CORRECTION

PATENT NO. : 4,317,208
DATED : February 23, 1982
INVENTOR(S) : Takashi ARASEKI et al.

It is certified that error appears in the above—identified patent and that said Letters Patent is hereby corrected as shown below:

Column 10, line 2, equation, delete "$E_j$" (both occurrences) and insert -- $\hat{E}_j$ -- ;

between lines 5 and 10, first equation, delete "$X_{j-1}$" and insert -- $\tilde{X}_{j-1}$ -- ;

between lines 10 and 15, second equation, delete "$E_j$" and insert -- $\hat{E}_j$ -- ; delete "$X_{j-1}$" and insert -- $\tilde{X}_{j-1}$ -- .

Signed and Sealed this

Third Day of August 1982

[SEAL]

Attest:

GERALD J. MOSSINGHOFF

Attesting Officer   Commissioner of Patents and Trademarks